(12) United States Patent
Kim

(10) Patent No.: US 6,822,494 B2
(45) Date of Patent: Nov. 23, 2004

(54) REGISTER CONTROLLED DELAY LOCKED LOOP

(75) Inventor: Kyung-Hoon Kim, Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 0 days.

(21) Appl. No.: 10/617,187

(22) Filed: Jul. 11, 2003

(65) Prior Publication Data

US 2004/0119515 A1 Jun. 24, 2004

(30) Foreign Application Priority Data

Dec. 24, 2002 (KR) .................... 10-2002-0083502

(51) Int. Cl.[7] .................................................. H03L 7/00
(52) U.S. Cl. ........................................ 327/160; 327/149
(58) Field of Search ............................... 327/160, 161, 327/149, 151, 153, 158

(56) References Cited

U.S. PATENT DOCUMENTS

| | | |
|---|---|---|
| 6,026,050 A | 2/2000 | Baker et al. |
| 6,333,959 B1 | 12/2001 | Lai et al. |
| 6,433,597 B2 | 8/2002 | Jung |
| 6,437,618 B2 | 8/2002 | Lee |
| 6,483,359 B2 | 11/2002 | Lee |
| 6,489,823 B2 | 12/2002 | Iwamoto |
| 6,593,786 B2 * | 7/2003 | Jung ........................ 327/158 |
| 2002/0000855 A1 | 1/2002 | Lee |
| 2002/0015338 A1 | 2/2002 | Lee |
| 2002/0043996 A1 | 4/2002 | Iwamoto |
| 2002/0130691 A1 | 9/2002 | Silvestri |
| 2003/0184355 A1 * | 10/2003 | Lee ........................... 327/158 |

* cited by examiner

Primary Examiner—Timothy P. Callahan
Assistant Examiner—Cassandra Cox
(74) Attorney, Agent, or Firm—Piper Rudnick LLP

(57) ABSTRACT

The present invention provides a register controlled delay locked loop (DLL) using an internal clock synchronized with an external clock as a delay monitoring clock source and a comparison standard clock source. The inventive register controlled DLL includes a first delay line; a second delay line; a delay model; a phase comparison means; a shift register control means; a master shift register; and a slave shift register.

20 Claims, 14 Drawing Sheets

REGISTER CONTROLLED DELAY LOCKED LOOP

FIELD OF THE INVENTION

The present invention relates to a semiconductor device circuit for a delay locked loop (DLL); and more particularly, to a register controlled DLL.

DESCRIPTION OF RELATED ARTS

Generally, a clock is used as a reference for adjusting operation timing. Furthermore, the clock may be used for guaranteeing a rapid operation without any error.

When an external clock is internally used in a circuit as an internal clock, a clock skew is generated by data paths and function blocks in the circuit. To have a same phase of the internal clock as that of the external clock, a delay locked loop (DLL) is used.

Recently, the DLL is much more commonly used for a synchronous semiconductor memory as well as a double data rate synchronous dynamic random access memory (DDR SDRAM) than a phase locked loop (PLL) because the DLL is less affected by a noise than the PLL. Especially, among many kinds of DLLs, a register controlled DLL is most commonly used.

For the synchronous semiconductor memory, a negative delay is reflected to make data output synchronized with the external clock, wherein the negative delay is generally obtained by compensating a delay element of a clock path or a data path after receiving the external clock.

FIG. 1 is a block diagram illustrating a conventional register controlled DLL for the DDR SDRAM. The register controlled DLL uses the internal clocks (Rclk and Fclk) outputted from a first and a second clock input buffer 100 and 102. The first clock input buffer 100 generates the internal clock (Rclk) synchronized at a rising edge of an ordinary external clock (CLK) by buffering the ordinary external clock (CLK). In addition, the second clock input buffer 102 generates the internal clock (Fclk) synchronized at a rising edge of a sub ordinary external clock (/CLK) by buffering a sub ordinary external clock (/CLK).

Referring to FIG. 1, the register controlled DLL includes the followings: a clock divider 110 generating a divided clock (Fb_D8) by dividing the internal clock (Rclk) by X, wherein X=8, wherein X is a positive integer; a first delay chain 120 inputting the internal clock (Rclk); a second delay chain 122 inputting the internal clock (Fclk); a third delay chain 124 inputting a clock (Fb_D8) divided for a phase comparison; a shift register 160 deciding a delay amount of the first, second and third delay chains 120, 122 and 124; a delay model 130 reflecting the delay element of a real clock path and a data path by inputting an output (Fb_DC) of the third delay chain 124; a phase comparator 140 for comparing the phase of the divided clock (Fb_D8) with the output (Fb_DM) of the delay model 130; a first DLL driver 170 for generating a DLL clock (Rclk_DLL) through getting a permission for the output (Rclk_DC) of the first delay chain during a delay locking; a second DLL driver 172 for generating another DLL clock (Fclk_DLL) through getting another permission for the output (Fclk_DC) of the second delay chain 122 during the delay locking; and a shift register controller 150 for controlling a shift direction of the shift register 160 by inputting the output (CS_PC) of the phase comparator 140.

FIG. 2 is a circuit diagram showing the delay chain of the register controlled DLL in accordance with the prior art. All of the first, second and third chains 120, 122 and 124 have a same constitution as shown in FIG. 2.

Referring to FIG. 2, m*n NAND gate respectively taking the input clock (clk_in) and each of delay selective signals expressed in an order of sel_1, . . . , sel_m−1, sel_m, sel_m+1, . . . , and sel_m*n as one input and another input is formed. In addition, m*n delay units expressed in an order of DU1, . . . , DUm−1, DUm, DUm+1, . . . , DUm*n is formed, wherein the delay units are controlled by each NAND gate.

Herein, each delay unit is constituted with two NAND gates, and especially, the $M^{th}$ delay unit (DUm) is constituted with a first NAND gate taking the output of a former delay unit (DUm−1) as one input and taking the output of the NAND gate (NANDm) corresponding to the delay unit (DUm) as another input, and a second NAND gate (NAND101) taking a supply power (VDD) as one input and taking the output of the first NAND gate (NAND100) as another input. Herein, the supply power is taken as the input for the first delay unit (DU1) instead of a previous delay unit because the first delay unit (DU1) doesn't have any former delay unit.

FIG. 3 is a circuit diagram showing a shift register of the register controlled DLL in accordance with the prior art.

Referring to FIG. 3, the shift register is constituted with many m*n stages. Describing one stage, each stage is constituted with a reverse latch (L) constituted with the NAND gate and an inverter (INV), a switching unit (S) for changing a value latched to the latch by being controlled by a shift signal such as sre, sro, slo and sle, and a logic composition unit (C) for compositing an ordinary output of the latch of a former stage and sub ordinary output of the latch of a next stage.

Herein, the latch of each stage accepts a reset signal (resetz) as one input of the NAND gate for an initialization and the sub ordinary output of the corresponding latch (L) is taken as another input.

The switching unit (S) is connected to an ordinary output terminal of the latch (L). In addition, the switching unit (S) is constituted with a first NMOS transistor M1 controlled by an odd shift right signal (sro), a second NMOS transistor M2 connected to the sub ordinary output terminal of the latch (L) and controlled by an even shift left signal (sle), a third NMOS transistor M3 for selectively generating a path between a ground power and the ordinary output terminal of the latch (L) together with the first NMOS transistor M1 by being controlled by the sub ordinary output of the latch of the former stage, and a fourth NMOS transistor M4 for selectively generating another path between the ground power and the sub ordinary output terminal of the latch (L) together with the second NMOS transistor M2 by being controlled by the ordinary output of the latch of the next stage. In addition, the former stage and the next stage are controlled by the even shift right signal (sre) and the odd shift left signal (slo) among the shift signals, e.i., sre, sro, slo and sle.

Furthermore, the logic composition unit (C) is embodied by using an OR gate inputting the sub ordinary output of the ordinary output terminal of the latch of the former stage and the sub ordinary output of the latch of the next stage.

FIG. 4 is a timing diagram showing the register controlled DLL illustrated in FIG. 1.

The operation of the register controlled DLL in accordance with the prior art will be explained referring to FIGS. 1 to 4.

First, the clock divider 110 generates a clock Fb-D8, which is synchronized in every $8^{th}$ clock of the ordinary and sub ordinary clocks by dividing the internal clock (Rclk) by 8. As a matter of convenience, the divided output (Fb_D8) of the clock divider is not shown in FIG. 4.

During an initial operation, the output (Fb_D8) of the clock divider 110 is inputted into the first delay unit of the third delay chain 124 and passes through the third delay chain 124. Thereafter, the output (Fb_08) passes through the delay model 130, and consequently, a required delay amount is obtained and the final output (Fb_08) of the clock divider 110 is output.

The phase comparator 140 compares the divided clock (Fb_D8) with the rising edge of the output clock (Fb_DM) of the delay model 130. The shift register controller 150 outputs a shift control signal (CS_SM2SR) in accordance with the output (CS_PC) of the phase comparator 140. For a delay monitoring, the clock (Fb_D8) inputted into the third delay chain 124 may be used as a standard clock. However, the divided clock (Fb_08) is not used for the standard clock. Usually, the divided clock (Fb_08) is reversed, and thereafter used as the standard clock.

In addition, the shift register 160 outputs the delay selective signal (CS_SR) by carrying out a shift operation corresponding to the shift control signal (CS_SM2SR), and thereby deciding the delay amount of the first, second and third delay chain 120, 122 and 124 by enabling one of delay units constituting the first, second and third delay chain 120, 122 and 124.

Thereafter, the delay locking is completed at the moment that a minimum jitter is obtained between the output clock (Fb_DM) of the delay model 130 of which the delay amount has been controlled and the divided clock (Fb_D8) by comparing the two clocks each other. At this time, the DLL clocks (Rclk_DLL and Fclk_DLL) outputted from the first and second DLL driver 170 and 172 can control an output buffer for allowing output data to be synchronized with the ordinary external clock (CLK) and the sub ordinary external clock (/CLK) and outputted.

As mentioned, in case that the number of the delay units constituting the first, second and third delay chain 120, 122 and 124 is m*n, the number of the latches included in the shift register 160 should be m*n too.

In case that the register controlled DLL in accordance with the prior art described above is set to perform a shifting operation from the left of the shift register 160, i.e., a shift right, during the initial operation, maximum number, that is, m*n clock cycles are required for the delay locking. In FIG. 4, a case requiring a delay locking time of a total 98 clock cycles is exemplified. Also, a case that the register controlled DLL is set up to perform the shift operation from the right of the shift register, i.e., a shift left, during the initial operation, the maximum number, that is, m*n clock cycles are required for the delay locking too.

Furthermore, the number of the delay units should be increased in order that the register controlled DLL is operated in a range of much broader operation frequency. The other hand, the range of the operation frequency is decreased, in case of reducing the delay time of the delay unit for the purpose of reducing the jitter. Consequently, the number of the delay units should be increased to satisfy both of an operation frequency property and a jitter property. However, if the number of the delay units is increased, a chip area should be increased. In short, the operation frequency property and jitter property of the conventional register controlled DLL have a relation of an inverse proportion.

SUMMARY OF THE INVENTION

It is, therefore, an object of the present invention to provide a register controlled delay locked loop (DLL) capable of having much faster delay locking time and satisfying an operation frequency property and a jitter property together with minimizing a chip area.

In accordance with an aspect of the present invention, there is provided a register controlled delay locked loop (DLL) using an internal clock synchronized with an external clock as a delay monitoring clock and a comparison reference clock, the register controlled delay locked loop (DLL) including: a first delay line having a plurality of sub delay chains grouped with a plurality of delay units for receiving the internal clock; a second delay line having a plurality of sub delay chains grouped with a plurality of delay units and receiving the delay monitoring clock and generating a second delayed clock; a delay model for generating a delay model signal by reflecting a delay condition of a real clock path on the second delayed clock from the second delay line; a phase comparison unit for generating a phase comparison signal by comparing a phase of the comparison reference clock with the delay model signal from the delay model; a shift register control unit for generating a shift control signal by responding to the phase comparison signal from the phase comparison unit; a master shift register for selecting one of the sub delay chains of the first delay line and the second delay line by responding to the shift control signal; and a slave shift register for selecting one of the delay units in the sub delay chain selected by the master shift register by responding to the shift control signal.

In accordance with an aspect of the present invention, there is provided a register controlled delay locked loop (DLL) using an internal clock synchronized with an external clock as a delay monitoring clock source and a comparison standard clock source, including: a first delay line having a plurality of sub delay chains grouped with a plurality of slave delay units and one master delay unit for receiving the internal clock and generating a first delay signal; a second delay line having a plurality of sub delay chains grouped with a plurality of slave delay units and one master delay unit for receiving the delay monitoring clock as the input and generating a second delay signal; a delay model for generating a delay model signal by reflecting a delay condition of a real clock path on the second delayed signal from the second delay line; a phase comparison unit for comparing a phase of the comparison reference clock with the delay model signal from the delay model and generating a phase comparison signal; a shift register control unit for generating a shift control signal by responding to the phase comparison signal from the phase comparison unit; a master shift register for selecting one among the master delay units of the first delay line and the second delay line by responding to the shift control signal; and a slave shift register for selecting one of the slave delay units in the sub delay chain selected by the master shift register by responding to the shift control signal.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, an inventive register controlled delay locked loop (DLL) capable of having much faster delay locking time and satisfying an operation frequency property and a jitter property together with minimizing a chip area will be described in detail referring to the accompanying drawings.

Figure 5:
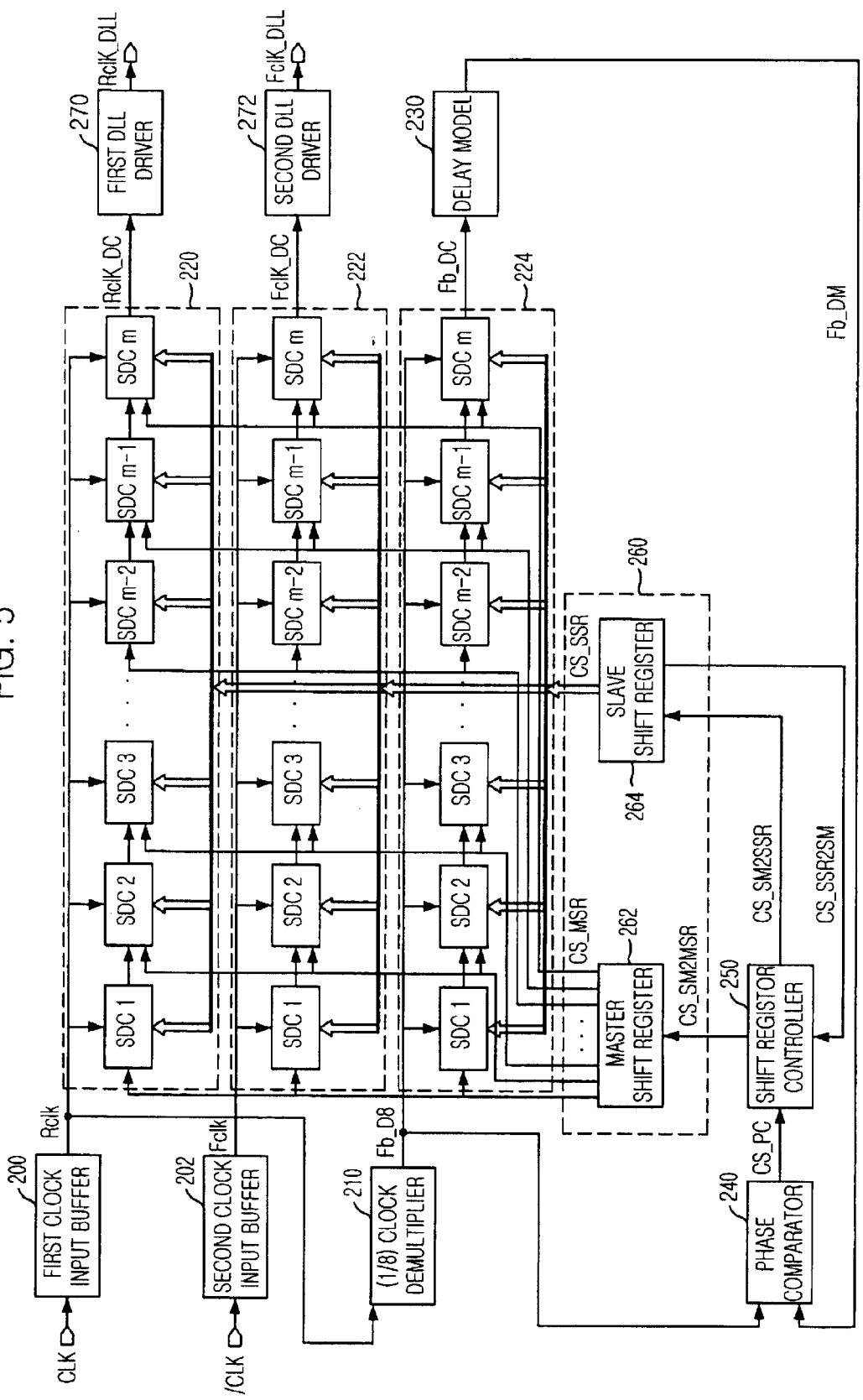
FIG. 5 is a block diagram illustrating a register controlled DLL of a DDR SDRAM in accordance with a preferred embodiment of the present invention.

FIG. 5 is a block diagram showing the register controlled DLL for a double data rate synchronous dynamic random access memory (DDR SDRAM) in accordance with a preferred embodiment of the present invention. The register controlled DLL of the DDR SDRAM uses internal clocks such as a first internal clock Rclk and a second internal clock Fclk outputted from a first clock input buffer 200 and a second clock input buffer 202. The first input buffer 200 generates an internal clock (Rclk) synchronized at a rising edge of an ordinary external clock (CLK) by buffering the sub ordinary external clock (/CLK).

Referring to FIG. 5, the register controlled DLL of the DDR SDRAM in accordance with a preferred embodiment of the present invention includes: a clock divider 210 generating a divided clock (Fb_D8) by dividing the internal clock (Rclk) by 1/X, wherein X is a positive integer number and x is defined as 8 in the preferred embodiment of the present invention; a first delay chain 220 receiving the first internal clock (Rclk) and generating a first delayed signal Rclk_DC; a second delay chain 222 receiving the second internal clock (Fclk) and generating a second delayed signal Fclk_DC; a third delay chain 224 receiving the divided clock (Fb_D8) for a phase comparison and generating a third delayed signal; a shift register unit 260 for deciding a delay amount of a first, second and third delay chain 220, 222 and 224; a delay model 230 for reflecting a delay element of a real clock path and a data path to generate a delay model signal by receiving the third delayed signal from the delay chain 224; a phase comparator 240 for comparing the delay model signal (Fb_DM) from the delay model 230 with the phase of the divided clock (Fb_D8); a first DLL driver 270 for generating a DLL clock (Rclk_DLL) by obtaining a permission of the first delayed signal (Rclk_DC) from the first delay chain 220 during a delay locking; a second DLL driver 272 for generating a DLL clock (Fclk_DLL) by obtaining the permission of a second delayed signal (Fclk_DC) of the second delay chain 222 during the delay locking; and a shift register controller 250 for controlling a shifting operation of the shift register unit 260.

The other hand, each of the first, second, and third delay chain 220, 222 and 224 of the register controlled DLL in accordance with a preferred embodiment of the present invention includes m sub delay chains (SDC) including n delay units. Herein, m and n are positive integer number.

In addition, the shift register unit 260 includes a master shift register 262 and a slave shift register 264 for controlling the first, second and third delay chain 220, 222 and 224. Herein, the shift register controller 250 controls the shifting operations of the master shift and the slave shift register 264.

Figure 6:
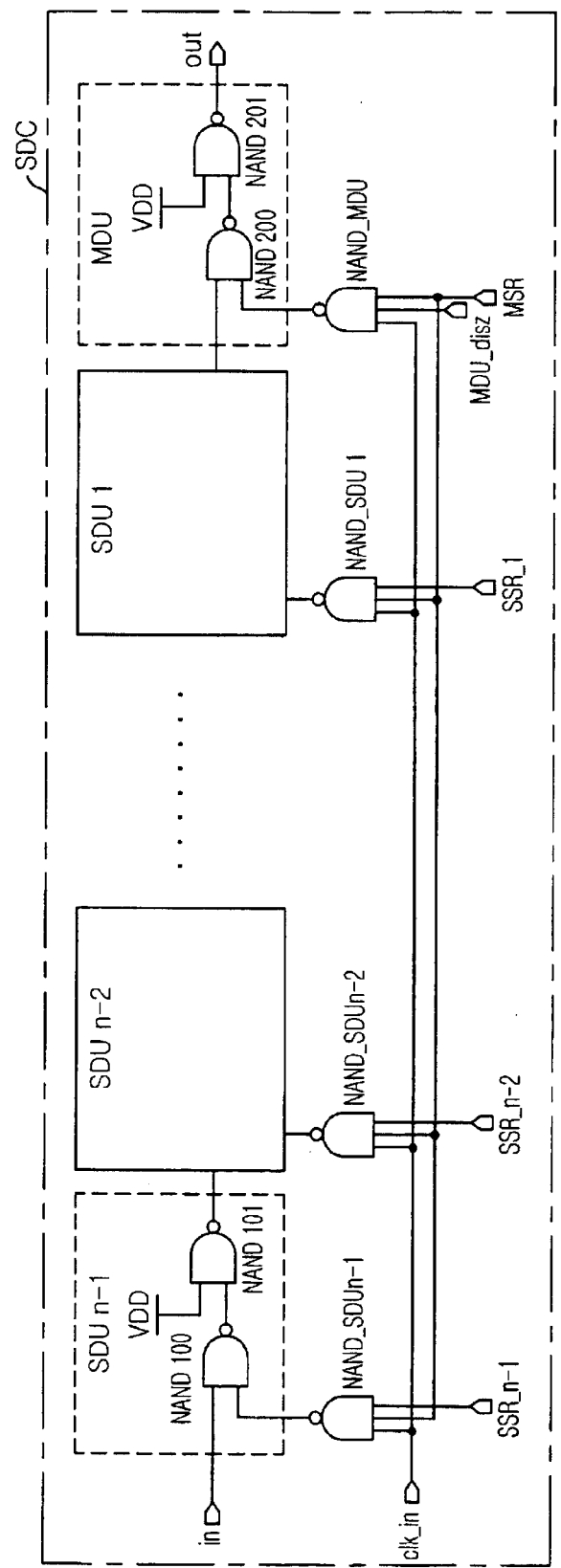
FIG. 6 is a diagram showing a sub delay chain (SDC) shown in FIG. 5.

FIG. 6 is a diagram showing the sub delay chain (SDC) shown in FIG. 5.

Referring to FIG. 6, the sub delay chain (SDC) includes total n delay units. A last unit of the sub delay chains (SDC) has the master delay unit (MDU) controlled by the master shift register 262.

In addition, each sub delay chain (SDC) includes three-input NAND gates (NAND_MDU, NAND_SDU 1, NAND_SDU 2, . . . NAND_SDU n−1) for performing on/off operation of a clock path for each delay unit, wherein the number of the three-input NAND gates is same as the number of the delay units, that is, n.

The master delay unit (MDU) includes a first NAND gate (NAND200) receiving the output of former sub delay unit (SDU 1) the output of the NAND gate as one input and another input, respectively, and a second NAND gate (NAND201) receiving a supply power (VDD) and the output of the first NAND gate (NAND200) as one input and another input, respectively. Also, n−1 slave delay units (SDU 1, SDU 2, . . . , SDU n−1) have same constitution as the master delay unit (MDU) does. Herein, such constitution of the delay unit can be modified easily.

In addition, the NAND gate (NAND_MDU) corresponding to the master delay unit (MDU) receives an input clock (clk_in), a master delay selective signal (MSR), a disables-ignal (MDU_disz) of the master delay unit. Also, the NAND gates (NAND_SDU 1, NAND_SDU 2, . . . , NAND_SDU n−1) respectively corresponding to n−1 slave delay units (SDU 1, SDU 2, . . . , SDU n−1) receives the input clock (clk_in), slave delay selective signals (SSR_1, SSR_2, . . . , SSR_n−1) and the master delay selective signal (MSR).

Figure 7:
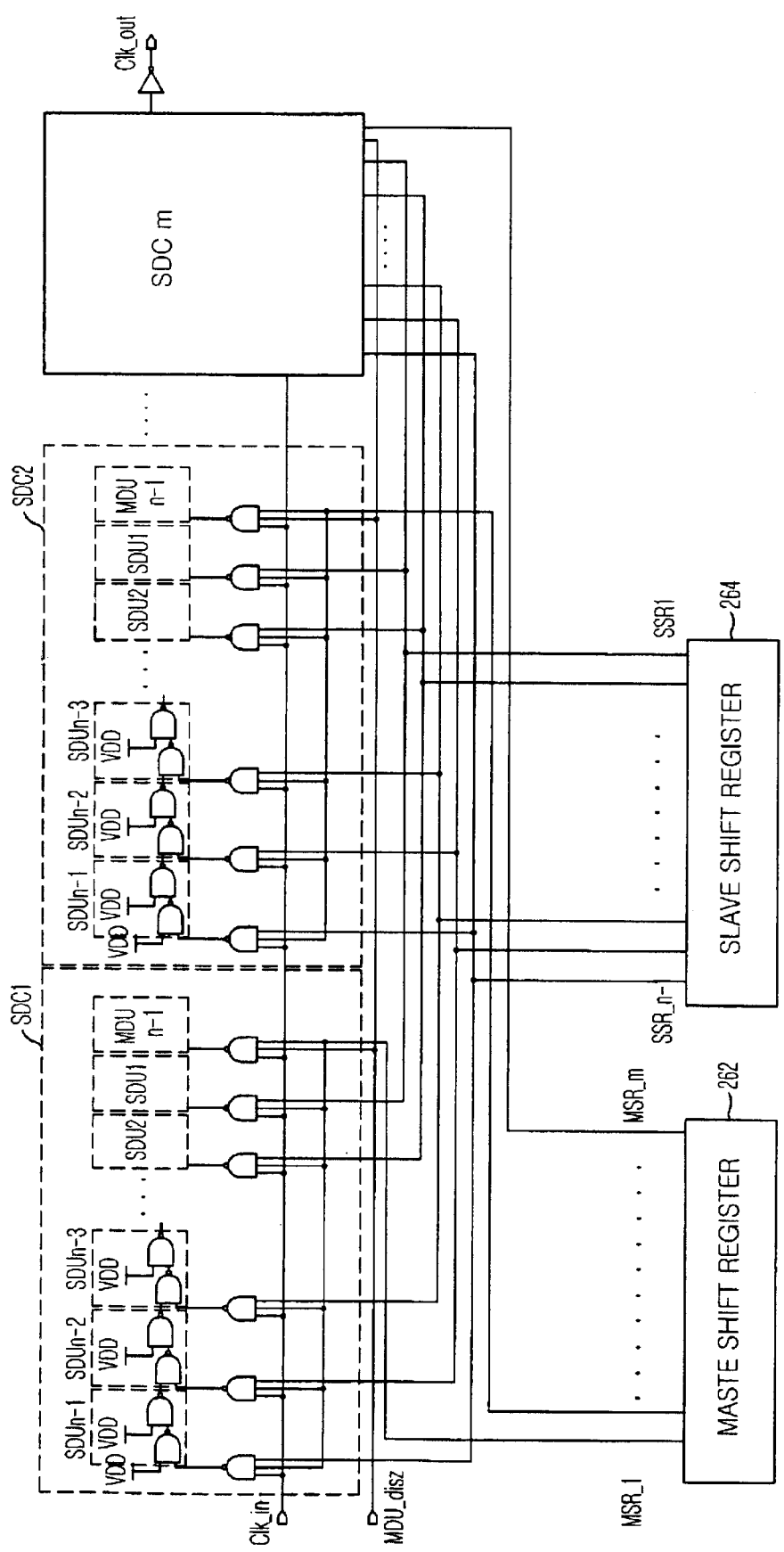
FIG. 7 is a diagram depicting a delay chain and a shift register shown in FIG. 5.

FIG. 7 is a diagram illustrating the delay chain and the shift register shown in FIG. 5. Herein, only one delay chain is illustrated. However, the first, second and third delay chain 220, 222 and 224 shown in FIG. 5 have all same constitution.

Referring to FIG. 7, each of m sub delay chains (SDC 1, SDC 2, . . . , SDC m) includes one master delay unit (MDU) and n−1 slave delay unit (SDU). Herein, the master delay unit (MDU) of each sub delay chain (SDC 1, SDC 2, SDCm) is controlled by m master delay selective signals (MSR_1, . . . , MSR_m) outputted from the master shift register 262, respectively. Furthermore, the n−1 slave delay selective signals (SSR_1, SSR_2, . . . , SSR_n−1) are inputted to each sub delay chain (SDC 1, SDC 2, . . . , SDC m). In short, the master delay unit (MDU) of the first sub delay chain (SDC 1) is controlled by the master delay selective signal (MSR_1) and the master delay unit (MDU) of the $m^{th}$ sub delay chain (SDC m) is controlled by the $m^{th}$ master delay selective signal (MSR_m). The other hand, the first slave delay unit (SDU 1) of the first sub delay chain (SDC 1) and the first slave delay unit (SDU 1) of the second sub delay chain (SDC 2) is controlled by the identical slave delay selective signal (SSR_1).

Also, the NAND gates (NAND_SDU 1, NAND_SDU 2, . . . , NAND_SDU n−1) corresponding to the slave delay units (SDU 1, SDU 2, ..., SDU n−1) of the sub delay chains (SDC 1, SDC 2, ..., SDC m) are controlled by the master delay selective signal corresponding to sub delay chain.

Figure 8A:
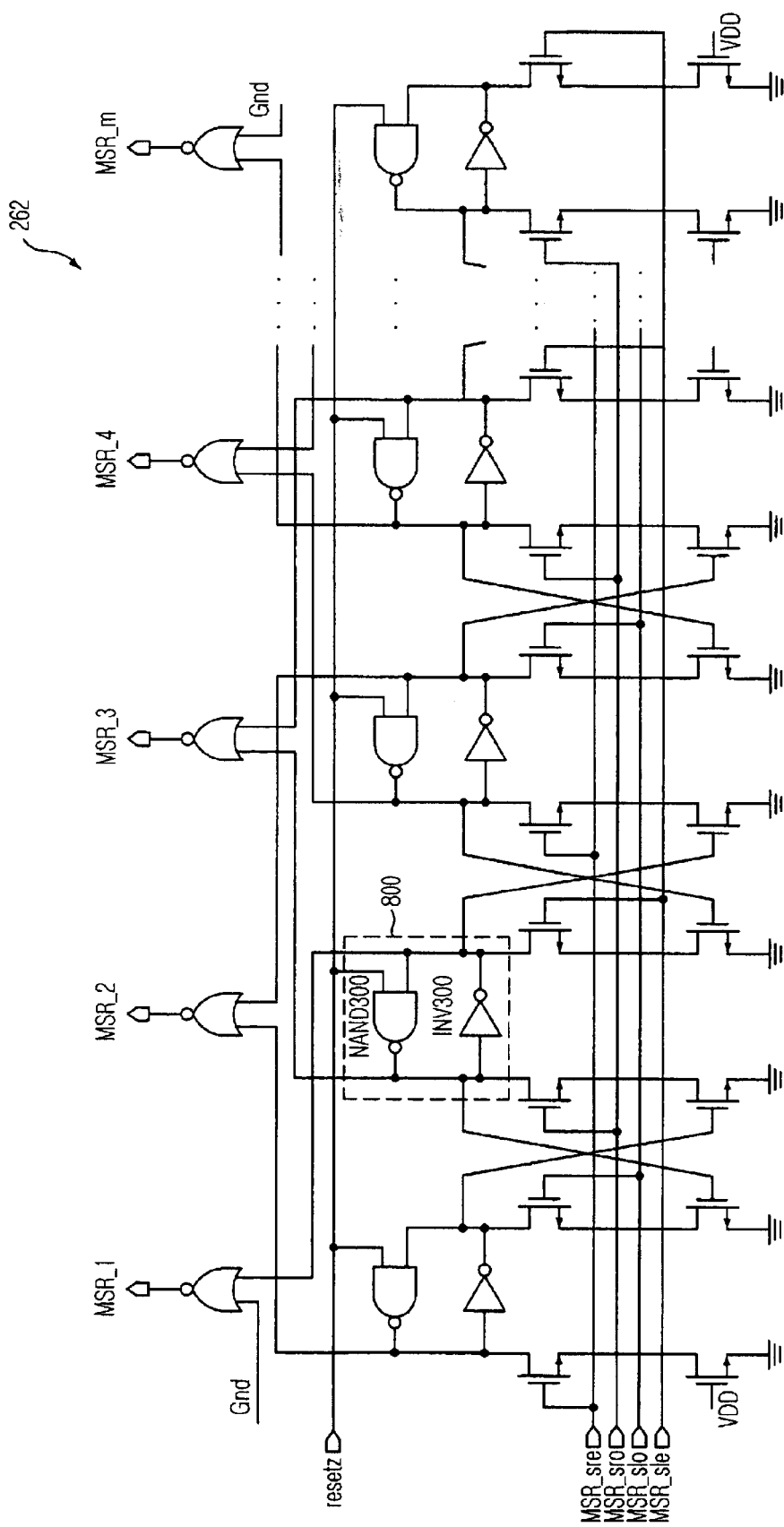
FIGS. 8A to 8B are diagrams illustrating a master shift register and a slave shift register shown in FIG. 5.
Figure 8B:
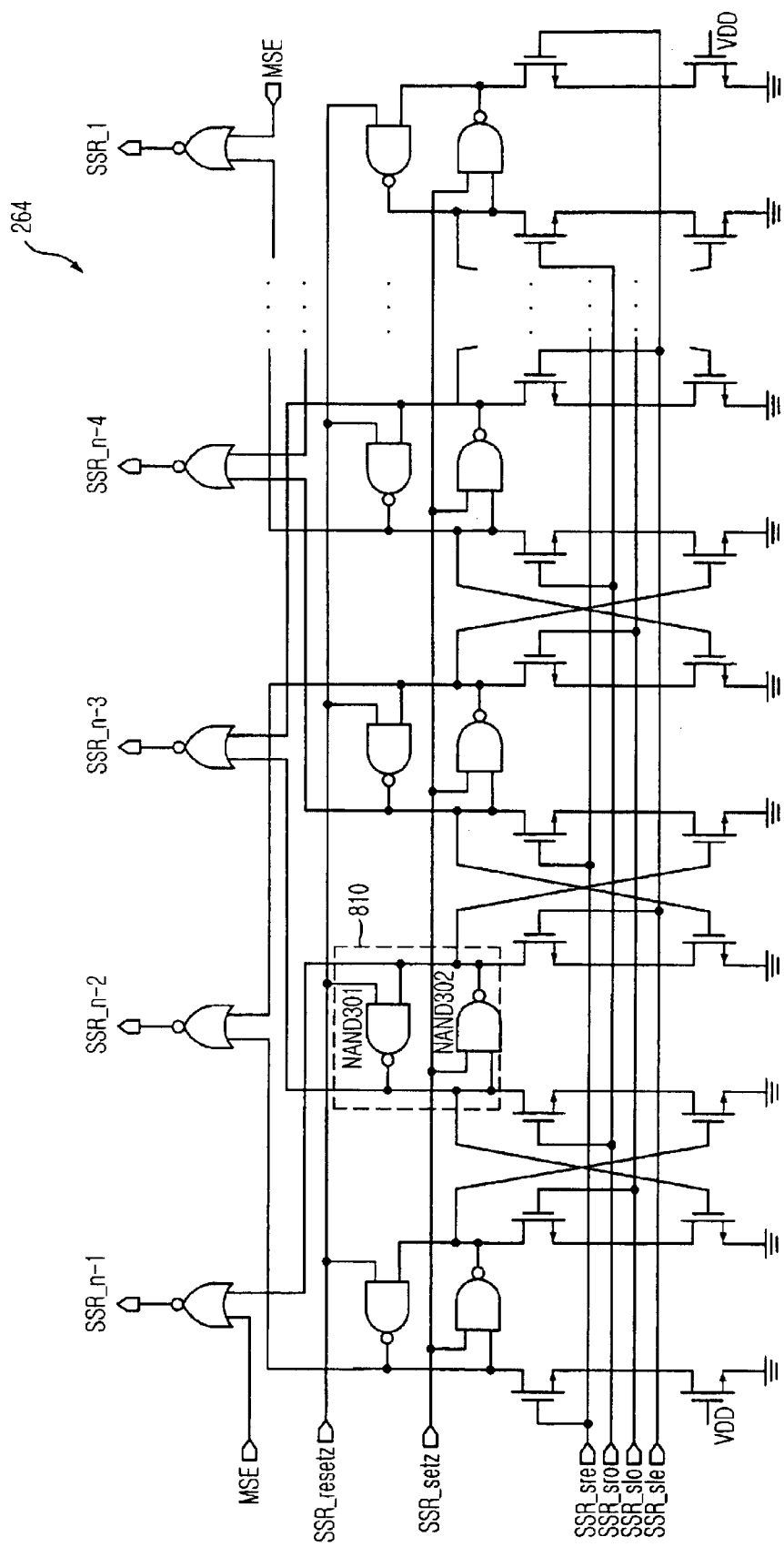

FIGS. 8A to 8B are diagrams illustrating the master shift register 262 and the slave shift register 264 shown in FIG. 5, respectively.

Figure 1:
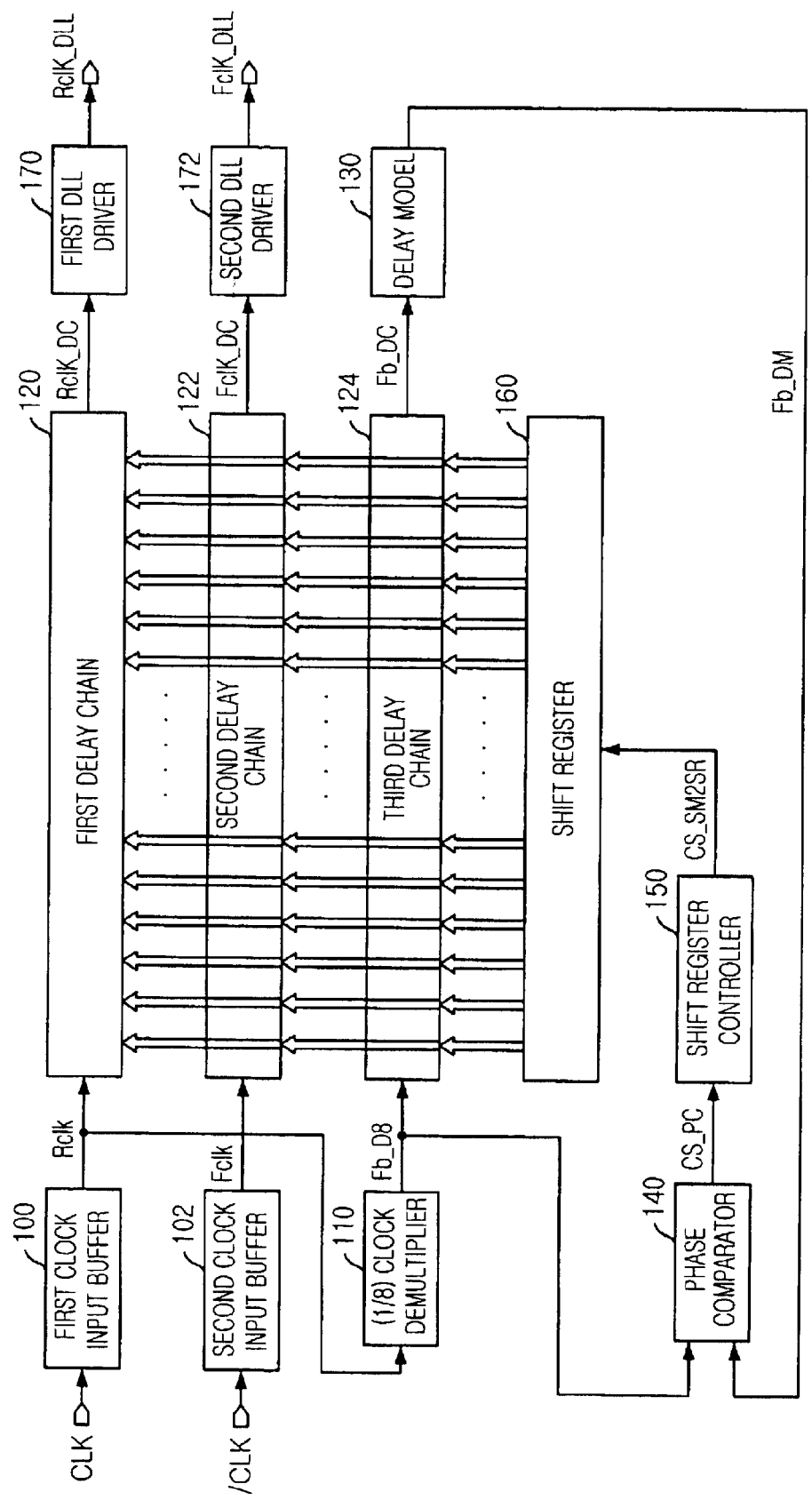
FIG. 1 is a block diagram illustrating a conventional register controlled DLL of a DDR SDRAM.
Figure 2:
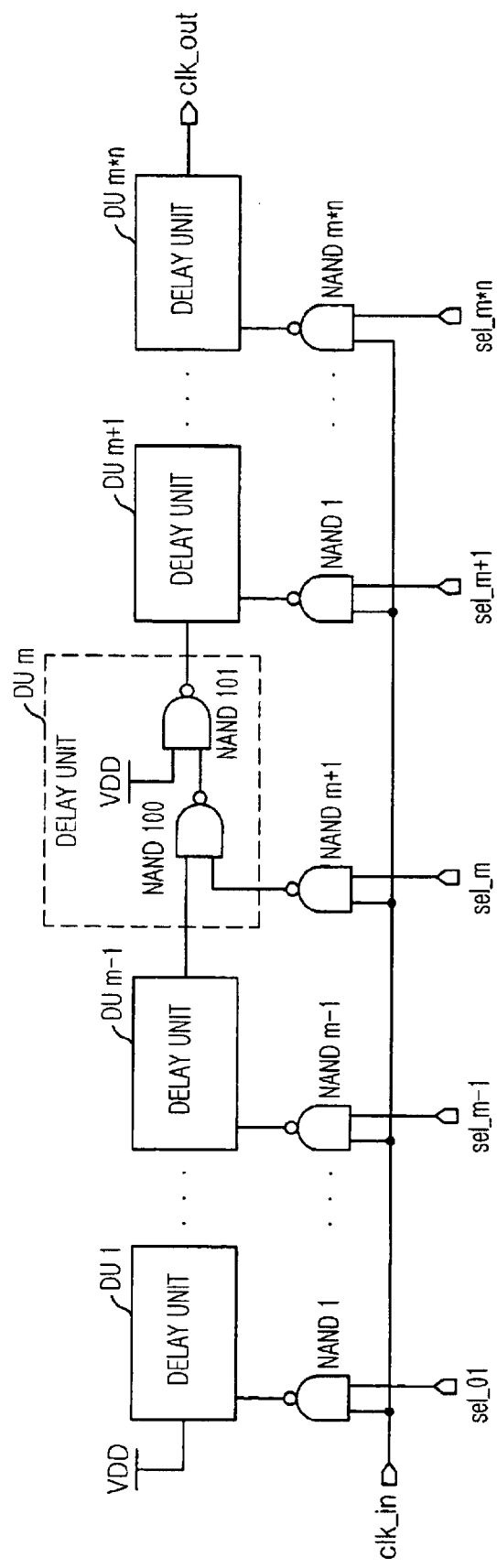
FIG. 2 is a circuit diagram showing a delay chain of a conventional register controlled DLL.
Figure 3:
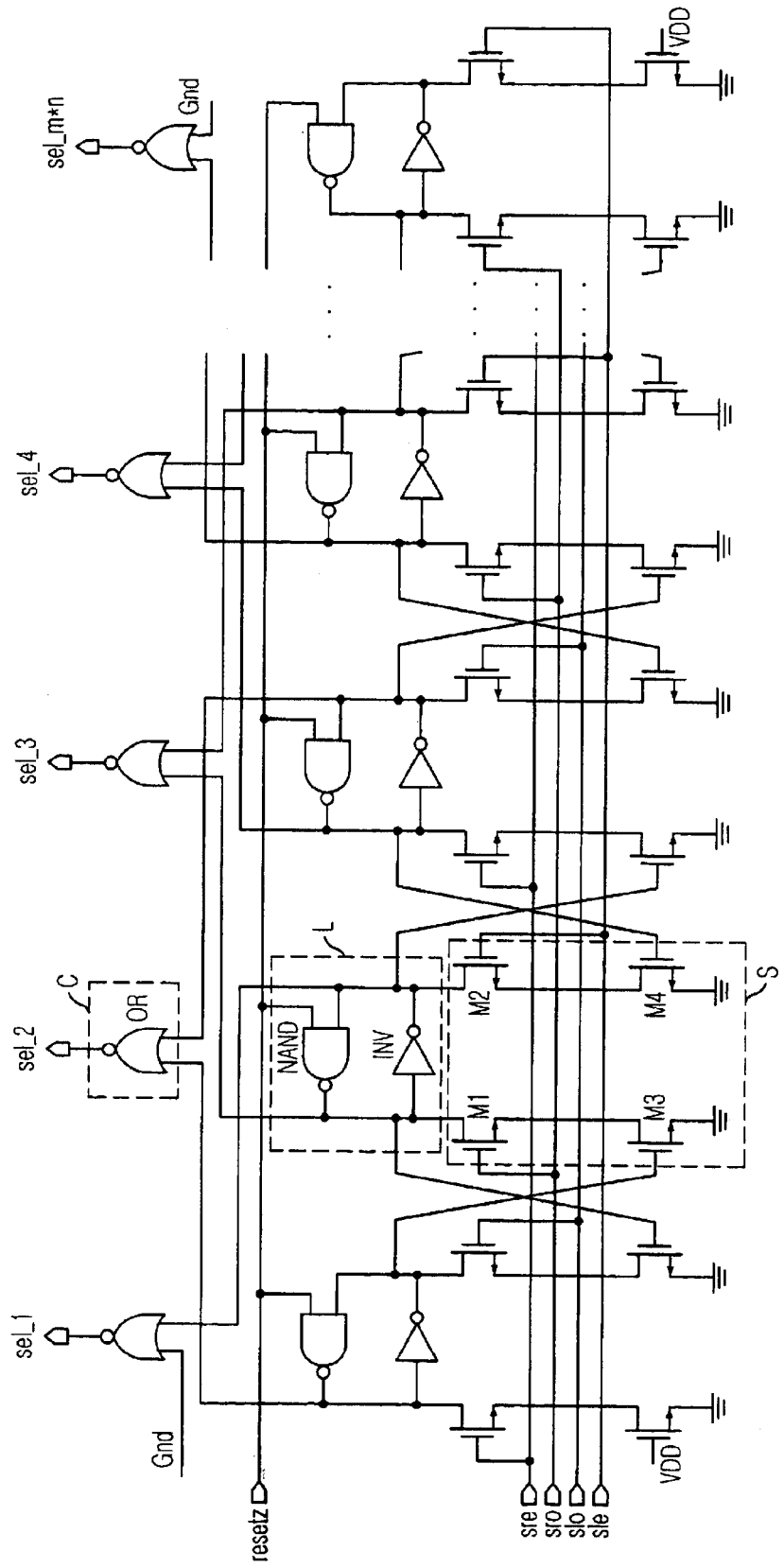
FIG. 3 is a circuit diagram depicting a shift register of a conventional register controlled DLL.
Figure 4:
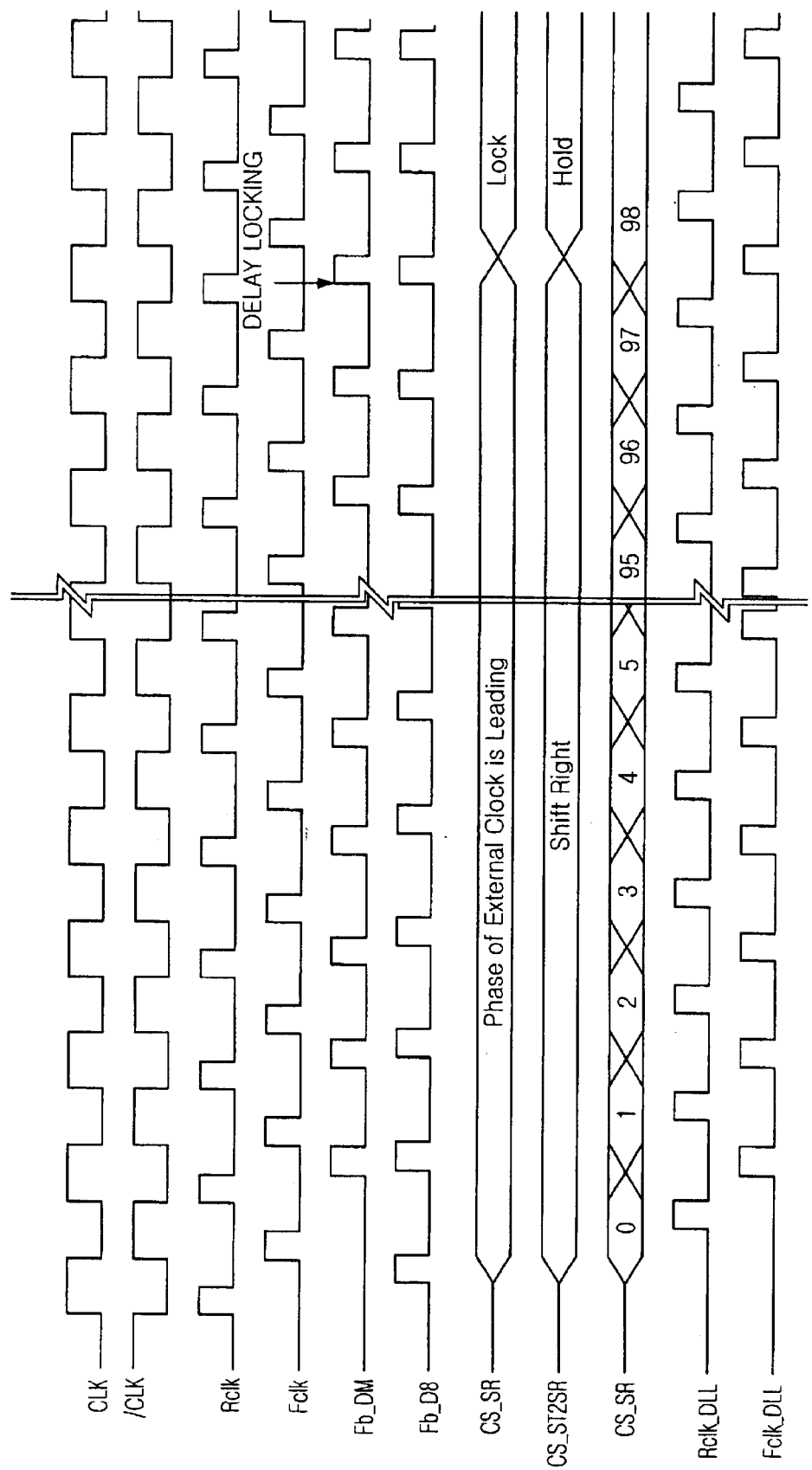
FIG. 4 is a timing diagram of a register controlled DLL shown in FIG. 1.

Referring to FIG. 8A, the master shift register 262 has a similar constitution with the shift register shown in FIG. 3. In short, the master shift register 262 is devised to carry out a shift right operation during an initial operation. Only, the shift register 262 is constituted with m*n stages. The other hand, the master shift register 262 is constituted with m stages. The constitution of each stage constituting the master shift register 262 is same as that of the shift register 264.

Next, referring to FIG. 8B, the slave shift register 264 has three different aspects in terms of the constitution when compared with the master shift register 262 shown in FIG. 8A.

First, the master shift register 262 uses a reset signal (resetz) only for initializing a latch value. The other hand, the slave shift register 264 uses a set signal (SSR_setz) together with the reset signal (SSR_resetz) and thereby, the latch 810 of each stage constituting the slave shift register 264 uses two NAND gates differently from the latch 800 of each stage constituting the master shift register 262. More specifically, the latch 800 of the master shift register 262 is constituted with the NAND gate (NAND300) receiving a sub ordinary output and the reset signal (resetz), and an inverter (INV300) supplying the sub ordinary output by receiving the output of the NAND gate as an input, wherein the latch 800 of the master shift register 262 has an identical constitution of the latch of the shift register. Also, the latch 810 of the slave shift register 264 is constituted with the NAND gate (NAND300) receiving the sub ordinary output and the reset signal (SSR_resetz) as its input and the NAND gate (NAND302) supplying the sub ordinary output by taking the ordinary output of the NAND gate (NAND300) and the set signal (SSR_setz) as the input.

Secondly, the master shift register 262 is devised to carry out a shift right operation during the initial operation and the slave shift register 264 is devised to carry out a shift left operation during the initial operation.

Last, the master shift register 262 uses one input of NOR gates of the first and last stage as a ground (Gnd) and the slave shift register 264 uses a master shifting enable signal (MSE) for one input of NOR gate of the first stage and the last stage. The signal (MSE) is for disabling all of the slave delay units (SDU 1, SDU 2, ..., SDU n−1) by disabling the first slave delay unit (SDU 1) and the last slave delay unit (SDU n−1) by setting a logic level high when carrying out the shifting operation toward the master delay unit (MDU) adjacent to the first and the last slave delay unit (SDU 1, SDU n−1) or carrying out the initial master shifting operation.

In addition, the master shift register 262 and the slave shift register 264 are not operated concurrently. In short, one of the master shift register 262 and the slave shift register 264 is in a holding state while the other is in an operation state.

Figure 9:
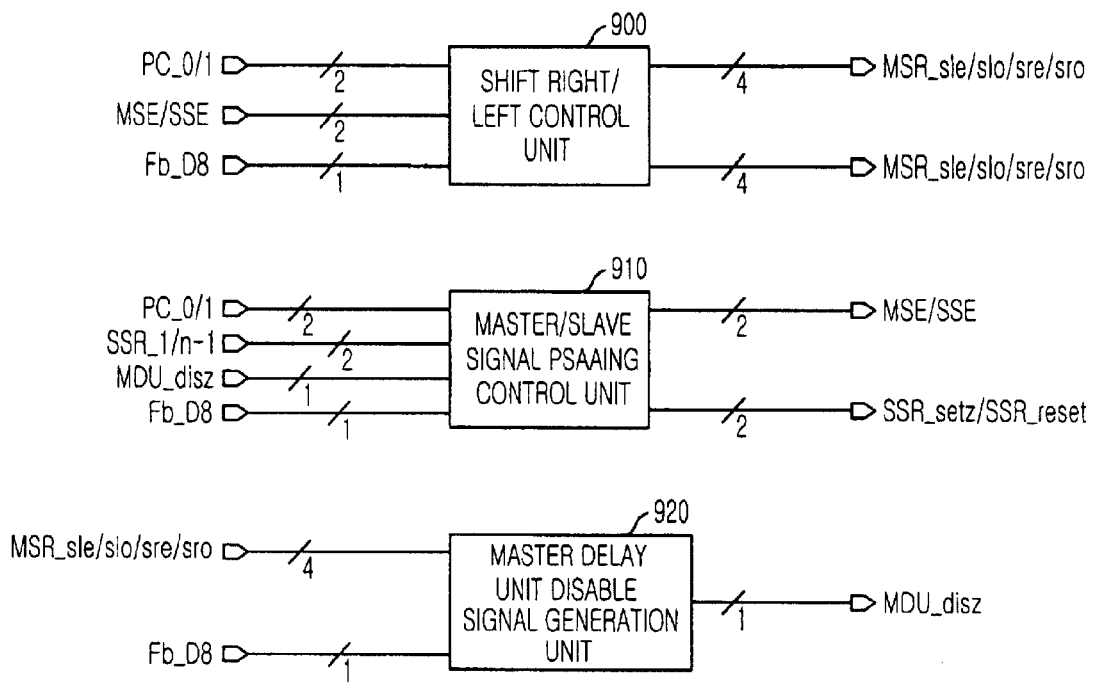
FIG. 9 is a diagram showing a detailed block of a shift register controller 250 shown in FIG. 5.

FIG. 9 is a detailed diagram showing the shift register controller 250 shown in FIG. 5.

Referring to FIG. 9, the shift register controller 250 roughly includes three blocks.

In detail, the shift register controller 250 includes a shift right/left controller 900 for generating a master shift signal such as MSR_sre, MSR_sro, MSR_sle and MSR_slo, and a slave shift signal such as SSR_sre, SSR_sro, SSR_sle and SSR_slo by receiving a phase comparison signal (PC_0/1), the master shifting enable signal (MSE), the slave shifting enable signal (SSE), and a divided clock (Fb_D8) as the input.

Also, the shift register controller 250 includes a master/slave signal passing control unit 910 for generating the master shifting enable signal (MSE), the slave shifting enable signal (SSE), the slave shift register set signal (SSR_setz) and the slave shift register reset signal (SSR_resetz) by receiving the phase comparison signal (PC_0/1), the first slave delay selective signal (SSR_1), the last slave delay selective signal (SSR_n−1), the master delay unit disable signal (MDU_disz) and the divided clock (Fb_D8) as the input.

Figure 10A:
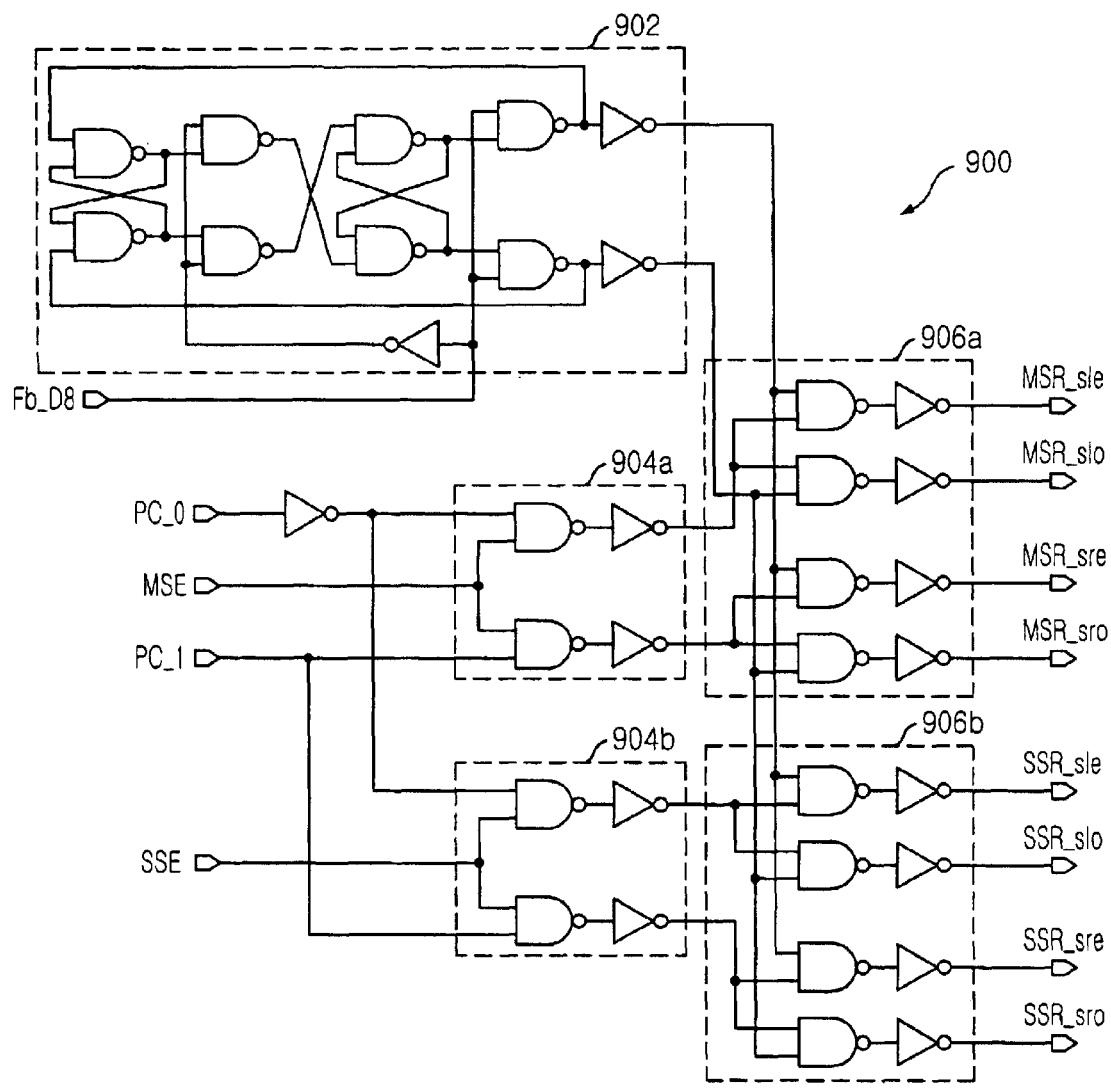
FIG. 10A is a diagram depicting a shift right/left control unit shown in FIG. 9.

FIG. 10A is a diagram showing the shift right/left control unit 900 shown in FIG. 9.

The shift right/left control unit 900 shown in FIG. 10A includes: a T-flip flop unit 902 for deciding a shifting point by receiving the divided clock (Fb_D8) as the input on itself, wherein the shifting operation is carried out once per one clock; a first logic composition unit 904A for blocking the phase comparison signal (PC_0/1) in case that the master shifting enable signal (MSE) is inactivated by logically compositing the phase comparison signal (PC_0/1) and the master shifting enable signal (MSE); a second logic composition unit 904B for blocking the phase comparison signal (PC_0/1) in case that the slave shifting enable signal (SSE) is in the inactivation state by logically compositing the phase comparison signal (PC_0/1) and the slave shifting enable signal (SSE); and a third logic composition unit 906A for outputting the master shift signal such as the MSR_sre, MSR_sro, MSR_sle and MSR_slo at a required point of time by logically compositing the output of the T-flip flop unit 902 and the second logic composition unit 904B. Also, a case embodying each block of the shift right/left control unit 900 shown in FIG. 10A by merely using the NAND gate and the inverter is exemplified. However, the embodiment for the block of the shift right/left control unit 900 can be obtained by adopting other logic gate.

Figure 10B:
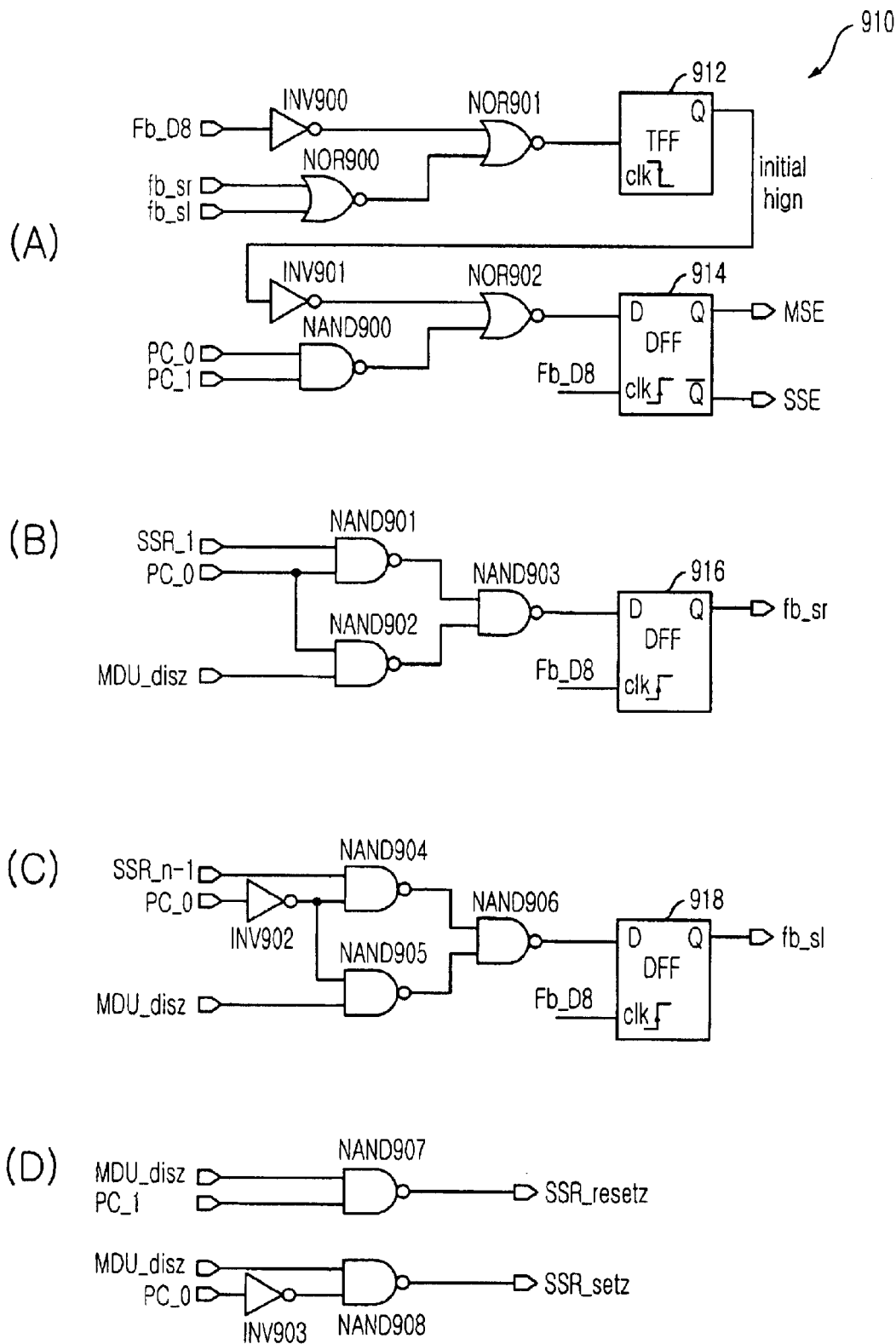
FIG. 10B is a diagram illustrating a master/slave signal passing control unit shown in FIG. 9.

FIG. 10B is a diagram showing the master/slave signal passing control unit 910 shown in FIG. 9.

(A) of FIG. 10B shows the block for generating the master shifting enable signal (MSE) and the slave shifting enable signal (SSE). The block shown in FIG. 10B (A) includes an inverter (INV900) receiving the divided clock (Fb_D8) as the input on itself; a NOR gate (NOR900) receiving a master/slave interlocking shift right signal (fb_sr) and a master/slave interlocking shift left signal (fb_sl); another NOR gate (NOR901) receiving the output of the NOR gate (NOR900) and the output of the inverter (INV900) as its input (INV901); the T-flip flop 912 receiving the output of the NOR gate (NOR901) as the input on itself 912; the inverter (INV901) receiving the output of the T-flip flop 912 as the input; the NAND gate (NAND900) receiving the phase comparison signal (PC_0, PC/1) as its input (NAND900); another NOR gate (NOR902) receiving the output of the NAND gate. (NAND900) and the output of the inverter (INV901) as the input on itself (NOR902); and a D-flip flop 914 for outputting the ordinary output (Q) of the master shifting enable signal (MSE) and the sub ordinary output of the slave shifting enable signal (SSE) by latching the output of the NOR gate (NOR902) through being synchronized at the rising edge of the divided clock (Fb_D8).

(B) of FIG. 10B illustrates the block for generating the master/slave interlocking shift right signal (fb_sr). The block (B) includes: the NAND gate (NAND901) receiving the first slave delay selective signal (SSR_1) and the phase comparison signal (PC_0) as its input; another NAND gate (NAND903) receiving the output of the NAND gate (NAND901) and the output of the NAND gate (NAND902) as its input (NAND903); and the D-flip flop 916 for latching the output of the NAND gate (NAND903) by being synchronized at the rising edge of the divided clock (Fb_D8).

(C) in FIG. 10B illustrates the block for generating the master/slave interlocking shift left signal. The block (C) includes: the inverter (INV902) receiving the phase comparison signal (PC_0) as its input (INV902); the NAND gate (NAND904) receiving the output of the inverter (INV902) and the last slave delay selective signal (SSR_n-1) as its on itself (NAND904); the NAND gate (NAND905) receiving the output of the inverter (INV902) and the master delay unit disable signal (MDU_disz) as its input on itself (SSR_n-1); the NAND gate (NAND906) receiving the output of the NAND gate (NAND904) and the output of the NAND gate (NAND905) as its input (NAND906); and the D-flip flop 918 for latching the output of the NAND gate (NAND906) by being synchronized at the rising edge of the divided clock (Fb_08).

Figure 10C:
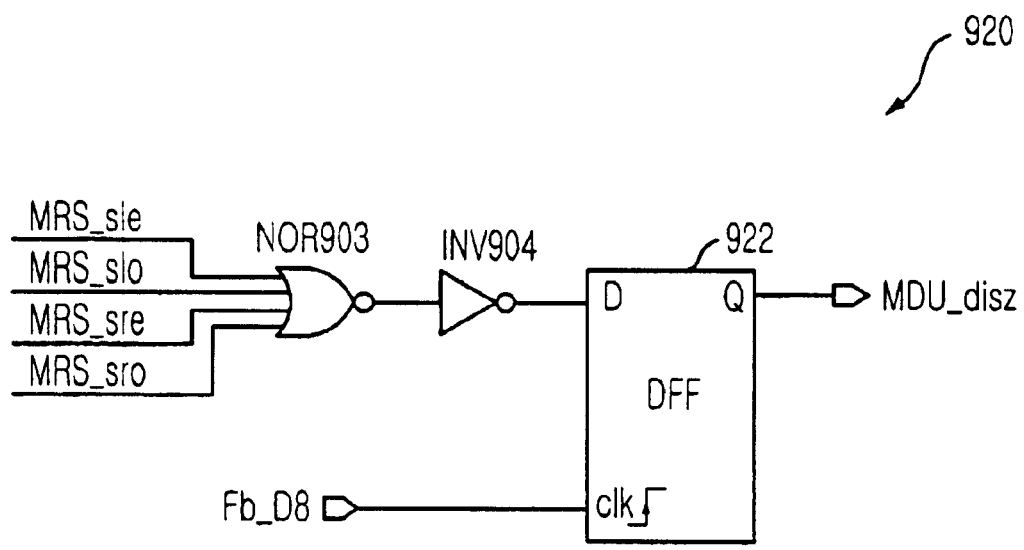
FIG. 10C is a diagram depicting a disable signal generation unit of a master delay unit shown in FIG. 9.

FIG. 10C is a diagram exemplifying the circuit constitution of a master delay unit disable signal generation unit 920 shown in FIG. 9.

Referring to FIG. 10C, the master delay unit disable signal generation unit 920 includes a four-input NOR gate (NOR903) receiving the master shift signal such as the MSR_sre, MSR_sro, MSR_sle and MSR_slo as its input, the inverter (INV904) receiving the output of the NOR gate (NOR903) as the input on itself (INV904); and the D-flip flop 922 for latching the output of the inverter (INV904) by being synchronized at the falling edge of the divided clock signal (Fb_D8).

Figure 11:
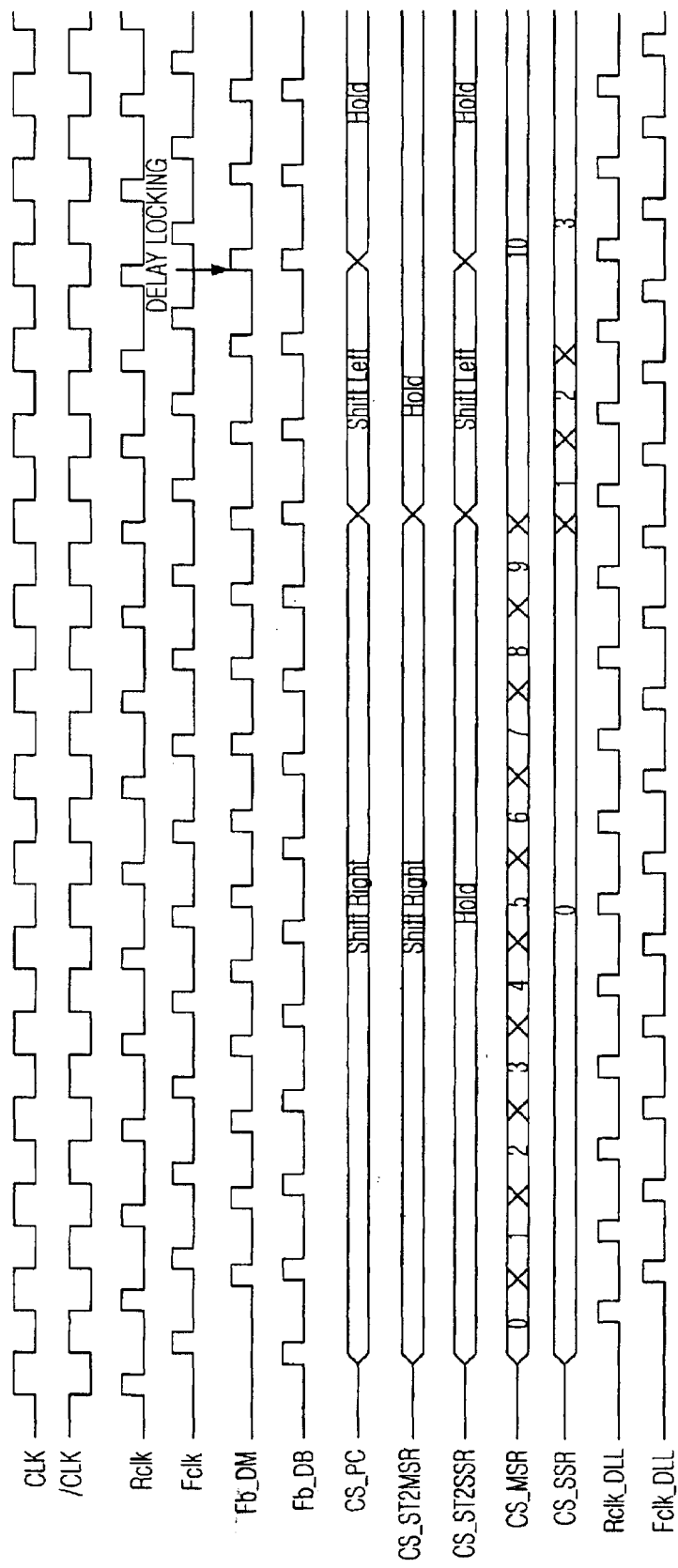
FIG. 11 is a timing diagram of the register controlled DLL shown in FIG. 5.

FIG. 11 is a timing diagram of the register controlled DLL shown in FIG. 5.

Hereinafter, the operation of the register controlled DLL in accordance with a preferred embodiment of the present invention will be described by referring to FIGS. 5 to 11.

First, the clock divider generates the divided clock signal (Fb_D8) synchronized once per $8^{th}$ clock of ordinary external clocks (CLK) by dividing the internal clock (Rclk) by 8. For a convenience, the output of the clock divider 210 is expressed in no divided state.

During an initial operation, the divided clock signal of the clock divider 210 is inputted into the master delay unit (MDU) of the first sub delay chain (SDC 1). Continuously, the divided clock signal inputted into the master delay unit (MDU) passes through the third delay chain 224 and thereafter, being outputted again. As a result, the divided clock signal is delayed by an expected delay amount after passing through the delay model 130. In short, the master shifting enable signal (MSE) is activated to have a high logic level and the slave shifting enable signal (SSE) is non-activated to have a low logic level. At this time, the master slave register 262 gets reset and thereby, setting the master delay selective signals (MSR_1, MSR_2, ..., MSR_m-1, MSR_m) as 1, 0, ..., 0, 0, respectively. In addition, the slave shift register 264 is also reset and the slave delay selective signals (SSR_1, SSR_2, ..., SSR_n-1) becomes 0, 0, ..., 0, respectively. Consequently, the divided clock signal (Fb_08) of the clock divider 210 passes through (m-1)*n+1 of total m*n.

Also, the phase comparator outputs the phase comparison signal (PC_0, PC_1) by comparing the rising edge of the delay model clock signal (Fb_DM) of the delay with the divided clock (Fb_D8). At this time, the phase comparison signal (PC_<0:1>) has three states such as '00', '10' and '11'. Herein, '00' means that the rising edge of the divided clock (Fb_D8) is advanced compared with the rising edge of the divided clock signal (Fb_D8) of the delay model 230 in terms of the phase. '11' means that the rising edge of the divided clock (Fb_D8) is delayed compared with that of the delay model clock signal (Fb_DM) of the delay model 230 in terms of the phase. Also, '10' means that the rising edge of the divided clock (Fb_D8) is same as that of the output clock (Fb_DM) of the delay model 230.

The phase comparison signal (PC_<0:1> for the initial operation is '11'. Cosequently, the shift register controller 250 makes the master shift signal (MSR_sre/sro/sle/slo) enabled and the master shift register 262 carry out the shift right operation per each clock. Herein, the delay amount of the first, second and third delay chain 220, 222, 224 gets reduced by same amount as one sub delay chain (SDC). As described above, the slave shift register 264 does not perform any operation when the master shift register 262 is in an operation. However, when the phase comparison signal (PC_<0:1>) becomes '00', the master shifting enable signal (MSE) is non-activated to have a low logic level. Also, as the slave shifting enable signal (SSE) becomes activated to have a high logic level, the slave shift register 264 finally becomes the low logic level. Referring to 8B, the master shifting enable signal (MSE) becomes the low logic level. Also, if the slave shift register set signal (SSR_setz) is activated, the slave delay selective signals (SSR_1, SSR_2, ..., SSR_n-1) become 1, 0, ..., 0, respectively and thereby, selecting the first slave delay unit (SDU_1) of the corresponding sub delay chain (SDC). Thereinafter, the shift register controller 250 makes the slave shift signal (SSR_sre/sro/sle/slo) enabled. The slave shift register 264 carries out the shift register operation per clock before the phase comparison signal (PC_<0:1>) becomes '10' and increases the delay amount of the second delay chain 224 by the same delay amount as one delay unit. The master shifting enable signal (MSE) becomes non-activated to have the low logic level while the operation of the slave shift register 264 is carried out. Consequently, all of the master shift signals (MSR_sre/sro/sle/slo) become the low logic level and the master shift register disable signal (MDU_disz) becomes activated to have the low state (refer to FIG. 10C). Consequently, the master shift register 262 is not operated anymore.

The delay locking is carried out while the slave shift register 264 constituted in the corresponding sub delay chain (SDC) is carried out. At this time, the DLL clocks (Rclk_DLL, Fclk_DLL) output from the first driver 170 and the second driver 172 can control a data output buffer to be output after being synchronized wherein the output data of the DLL clocks (Rclk_DLL, Fclk_DLL) is synchronized with the ordinary external clock (CLK) and the sub ordinary external clock (/CLK).

In case that the delay chain includes m sub delay chains (SDC) grouping n delay units, the clock cycle required for the delay blocking can be reduced up to 1/n for the prior clock cycle. Referring to FIG. 10, only 13 clock cycles can be delay-locked in accordance with one embodiment of the present invention. In case of the prior art, 98 clock cycles is required for the delay locking. In short, if the present invention is applied, the number of the stages can be prominently reduced. In addition a chip area can be prominently reduced too.

Also, a case that a delay value of the delay unit is changed by a change of a temperature and a voltage may occurs even after the above-mentioned delay locking is completed. In this case, the register controlled DLL should be operated again. At this time, an adjustment for a final delay value obtained by the shift right/left operation during the initial operation. At this time, it is not needed that an initialization for the master shift register 262 and the slave shift register 260 are carried out. The master shift register 262 merely performs the shift right operation during the initial operation and the slave shift register 264 merely carry out the shift left operation. The other hand, for the succeeding operations, the master shift register 262 may performs the shift left operation or the slave shift register 264 may performs the shift right operation, wherein a various interlocking operation between the master delay unit (MDU) and the slave delay units (SDU 1, SDU n−1) adjacent to the master delay unit (MDU) is required. In short, the shifting operation for the adjacent master delay unit (MDU) in the corresponding sub delay chain or the shifting operation for the slave delay unit (SDU n−1) of the next sub delay chain in the master delay unit (MDU) of the corresponding sub delay chain is required.

Four cases that the master shift register 262 and the slave shift register 264 should be interlocked are described below.

(Case 1)

The shifting operation for the master delay unit (MDU) of the corresponding sub delay chain in the first slave delay unit (SDU 1) of the corresponding sub delay chain.

(Case 2)

The shifting operation for the first slave delay unit (SDU 1) of the corresponding sub delay chain in the master delay unit (MDU) of the corresponding sub delay chain.

(Case 3)

The shifting operation for the master delay unit (MDU) of the prior sub delay chain in the last slave delay unit (SDU n−1) of the corresponding sub delay chain.

(Case 4)

The shifting operation for the last slave delay unit (SDU n−1) of the next sub delay chain in the master delay unit (MDU) of the corresponding sub delay chain.

The case 1 describes a situation that the operation of the master shift register 262 is required while the slave shift register 264 is operated. In this case, the master/slave interlocking shift right signal (fb_sr) is activated to have the high logic level after the master delay unit disable signal (SSE) is non-activated to have the high logic level (refer to FIG. 10B (B)). Consequently, all outputs (SSR_1, SSR_2, . . . , SSR_n−1) of the slave shift register 264 become the low logic level and thereby, the clock path for the slave delay units (SDU 1, SDU 2, . . . , SDU n−1) is blocked and the clock path for the adjacent master delay unit (MDU) is opened.

Next, the case 2 describes another situation that the operation of the slave shifting operation is required when the master delay unit (MDU) is chosen. Referring to FIG. 10B (C), the master delay unit disable signal (MDU_disz) is activated to have the low logic level and thereby, the master/slave interlocking shift left signal (fb_sl) is activated to have the high logic level. Consequently, the master shifting enable signal (MSE) is non-activated to have the low logic level and the slave shifting enable signal (SSE) is activated to have the high logic level (refer to FIG. 10B (A)). Also, as the master delay unit disable signal (MDU_disz) is activated to have the low logic level, the slave shift register set signal (SSR_setz) is activated (refer to FIG. 10B (D)) and the slave delay selective signals (SSR_1, SSR_2, . . . , SSR_n−1) become 1, 0, . . . , 0, respectively. Consequently, the clock path for the first slave delay unit (SDU 1) gets opened. The above-mentioned steps are also applied even to the initial operation.

The case 3 describes another situation that the operation of the master shift register 262 is required during the operation of the slave shift register 264. The operation described in this case 3 is similar to that described in the case 1. In short, the operation of the case 3 becomes same as that of the case 1 if the master shift register 262 is left-shifted once.

Next, the case 4 describes the other situation that the operation of the master shift register 262 is required when the master delay unit (MDU) is chosen. Herein, the master delay unit disable signal (MDU_disz) is activated to have the low logic level and thereby, the master/slave interlocking shift right signal (fb_sr) is activated to have the high logic level (refer to FIG. 10B (A)). Consequently, the master shifting enable signal (MSE) is non-activated to have the low logic level and the slave shifting enable signal (SSE) is activated to have the high logic level. Also, as the master delay unit disable signal (MDU_disz) is activated to have the low logic level, the slave shift register reset signal (SSR_resetz) is activated (refer to FIG. 10B (D)) and the slave delay selective signal (SSR_1, SSR_2, . . . , SSR_n−1) become 0, 0, . . . , 1, respectively. Consequently, the clock path for the last slave delay unit (SDU n−1) of the next sub delay chain gets opened. At this time, all slave delay units (SDU 1, SDU 2, . . . , SDU n−1) of the next sub delay chain are controlled by the master delay selective signal (MRS) of the sub delay chain (refer to FIG. 6 and FIG. 7). Consequently, the shift left operation of the master shift register 262 should be carried out once although the master delay unit (MDU) of the sub delay chain gets disabled.

For reference, a technique for reducing a consumption time for the delay locking by using a coarse delay unit and a fine delay unit among the prior register controlled DLLs has ever been suggested. However, the technique had some drawbacks failing to keep and obtain the delay locking because a discontinuous point between the coarse delay unit and the fine delay unit is formed. According to the present invention, it seems that there are two delay units, which are different from each other, in a point of view of an external control. However, the discontinuous point does not exist in reality because the delay chain is constituted through grouping a plurality of delay units having a same delay time.

The present invention is explained by using a case a master shift register performs a shift right operation in the initial operation and a slave shift registers are operated left shift left operation. However, the present invention can be implemented as using the master shift register to operate a shift left operation the slave shift register to operate a shift right operation in the initial mode. In this case, the master delay unit is allocated at a front of the sub delay chain and the slave delay unit is allocated at a back of the master delay unit.

Furthermore, the present invention uses the internal clock rclk, which is synchronized at a rising edge of the external clock CLK, as a clock source for monitoring and comparing delay. However, the present invention can use an internal clock fclk, which is synchronized at a falling edge of the external clock CLK as a clock source.

Moreover, the register controlled DLL can be used to not only DDR SDRAM but also any other synchronous semiconductor memory devices.

As mentioned above, the present invention can significantly reduce a chip area occupied by the register controlled DLL by significantly reducing the number of stages of shift registers and power consumption is also reduced. Furthermore, the present invention can reduced the number of clock wasted for delay locking.

What is claimed is:

1. A register controlled delay locked loop (DLL) using a comparison reference clock and a delay monitoring clock which are internal clocks synchronized with an external clock, the register controlled delay locked loop (DLL) comprising:
  a first delay line having a plurality of sub delay chains grouped with a plurality of delay units for receiving the internal clock;
  a second delay line having a plurality of sub delay chains grouped with a plurality of delay units and receiving the delay monitoring clock and generating a second delayed clock;
  a delay model for generating a delay model signal by reflecting a delay condition of a real clock path on the second delayed clock from the second delay line;
  a phase comparison means for generating a phase comparison signal by comparing a phase of the comparison reference clock with the delay model signal from the delay model;
  a shift register control means for generating a shift control signal by responding to the phase comparison signal from the phase comparison means;
  a master shift register for selecting one of the sub delay chains of the first delay line and the second delay line by responding to the shift control signal; and
  a slave shift register for selecting one of the delay units in the sub delay chain selected by the master shift register according to the shift control signal.

2. The register controlled DLL as recited in claim 1, further comprising:
  a clock dividing means for generating the delay monitoring clock and the comparison reference clock by dividing the internal clock.

3. The register controlled DLL as recited in claim 1, further comprising:
  a DLL driving means for generating a DLL clock by receiving the first delayed signal from the first delay chain at a delay locking.

4. The register controlled DLL as recited in claim 1, wherein the master shift register and the slave shift register are independently operated, respectively.

5. The register controlled DLL as recited in claim 4, wherein the master shift register and the slave shift register performs a shift operation in opposite directions, respectively.

6. A register controlled delay locked loop (DLL) using a comparison reference clock and a delay monitoring clock which are internal clocks synchronized with an external clock, comprising:
  a first delay line having a plurality of sub delay chains grouped with a plurality of slave delay units and one master delay unit for receiving the internal clock and generating a first delay signal;
  a second delay line having a plurality of sub delay chains grouped with a plurality of slave delay units and one master delay unit for receiving the delay monitoring clock as the input and generating a second delay signal;
  a delay model for generating a delay model signal by reflecting a delay condition of a real clock path on the second delayed signal from the second delay line;
  a phase comparison means for comparing a phase of the comparison reference clock with the delay model signal from the delay model and generating a phase comparison signal;
  a shift register control means for generating a shift control signal by responding to the phase comparison signal from the phase comparison means;
  a master shift register for selecting one among the master delay units of the first delay line and the second delay line by responding to the shift control signal; and
  a slave shift register for selecting one of the slave delay units in the sub delay chain selected by the master shift register by responding to the shift control signal.

7. The register controlled DLL as recited in claim 6, further comprising:
  a clock dividing means for generating the delay monitoring clock and the comparison standard clock by dividing the internal clock.

8. The register controlled DLL as recited in claim 6, further comprising:
  a DLL driving means for generating a DLL clock by receiving the first delayed signal from the first delay chain at a delay locking.

9. The register controlled DLL as recited in claim 6, wherein the master delay unit is disposed at a hindmost part of the sub delay chain and a front of the master delay unit.

10. The register controlled DLL as recited in claim 9, wherein the master shift register and the slave shift register are independently operated, respectively.

11. The register controlled DLL as recited in claim 10, wherein the master shift register performs a shift right operation and the slave shift register performs a shift left operation at an initial mode.

12. The register controlled DLL as recited in claim 9, wherein the master shift register has same number of stages as the number of the sub delay chains.

13. The register controlled DLL as recited in claim 12, wherein the slave shift register has same number of stages as the number of the slave delay units in one of the sub delay chains and an output of the slave shift register is commonly used for each sub delay chain.

14. The register controlled DLL as recited in claim 13, wherein the shift register control means includes a shift right/left control unit for controlling a shift operation of the master shift register and the slave shift register by responding to the phase comparison signal.

15. The register controlled DLL as recited in claim 14, wherein the shift register control means includes a master delay unit disable signal generation unit for generating the master delay unit disable signal by responding to the shift control signal for controlling the shift right/left operation of the master shift register.

16. The register controlled DLL as recited in claim 15, wherein the master delay unit in each sub delay chain is controlled by an output of the master shift register and the master delay unit disable signal.

17. The register controlled DLL as recited in claim 16, wherein the slave delay chain in each sub delay chain is controlled by the output of the master shift register for selecting the master delay unit of the corresponding sub delay chain.

18. The register controlled DLL as recited in claim 15, wherein the shift register control means includes a master/slave signal passing control unit for providing an interlocking between the master delay unit and the slave delay unit adjacent to the master delay unit during a delay re-adjustment after the delay locking is completed by the initial operation.

19. The register controlled DLL as recited in claim 18, wherein the master/slave signal passing control unit generates the phase comparison signal, the output of the slave shift register for selecting a first slave delay unit, the output of the slave shift register for selecting a last slave delay unit, a master shifting enable signal by responding to the master delay unit disable signal, the slave shifting enable signal, a slave shifting enable signal, a slave shift register set signal, and a slave shift register reset signal.

20. The register controlled DLL as recited in claim 19, wherein the shift right/left control unit is controlled by the master shifting enable signal and the slave shifting enable signal.

* * * * *